(12) United States Patent  
Daniel et al.

(10) Patent No.: US 9,092,711 B2  
(45) Date of Patent: Jul. 28, 2015

(54) METHOD FOR PRODUCING A SMARTCARD BODY FOR RECEIVING A SEMICONDUCTOR CHIP AND SMARTCARD BODY OF THIS TYPE

(71) Applicant: Pretema GmbH, Niefern (DE)

(72) Inventors: Eric Daniel, Niefern (DE); Frank Eberhardt, Niefern (DE); Sébastien Kalck, Niefern (DE); Frédéric Morgenthaler, Niefern (DE); Rainer Mutz, Niefern (DE); Timo Schabinger, Niefern (DE)

(73) Assignee: Pretema GmbH, Niefern (DE)

( * ) Notice: Subject to any disclaimer, the term of this patent is extended or adjusted under 35 U.S.C. 154(b) by 0 days.

(21) Appl. No.: 14/522,086

(22) Filed: Oct. 23, 2014

(65) Prior Publication Data

US 2015/0076240 A1 Mar. 19, 2015

Related U.S. Application Data

(63) Continuation of application No. PCT/EP2013/001245, filed on Apr. 25, 2013.

(51) Int. Cl.  
*G06K 19/077* (2006.01)  
*H01L 23/495* (2006.01)  
*H01L 21/48* (2006.01)  
*H01L 21/52* (2006.01)

(52) U.S. Cl.  
CPC ........ *G06K 19/0772* (2013.01); *H01L 21/4842* (2013.01); *H01L 21/52* (2013.01); *H01L 23/49541* (2013.01)

(58) Field of Classification Search  
CPC G06K 19/0772; H01L 21/4842; H01L 21/52; H01L 23/49541  
See application file for complete search history.

(56) References Cited

U.S. PATENT DOCUMENTS

| 5,438,481 A | 8/1995 | Murphy et al. |
| 2005/0174767 A1 | 8/2005 | Flaherty et al. |
| 2008/0017972 A1 | 1/2008 | Bauer et al. |

FOREIGN PATENT DOCUMENTS

| DE | 10 2008 033018 A1 | 2/2010 |
| EP | 1785916 A1 | 5/2007 |

*Primary Examiner* — Sonji Johnson  
(74) *Attorney, Agent, or Firm* — Hackler Daghighian & Martino

(57) ABSTRACT

A method for producing a smartcard body for receiving a semiconductor chip includes forming at least one lead frame of the smartcard body in a carrier material connected by at least one material strip. Surrounding the at least one lead frame is an electrically insulating casing having a cavity for receiving the semiconductor chip. Either before or during the forming of the casing, the at least one material strip is separated or severed, so that the material strip is separated into a first strip part connected with the carrier material and a second strip part connected with the lead frame forming an interspace there between. When forming the casing at least a portion of the first strip part as well as at least a portion of the second strip part of the at least one material strip is comprised by the casing.

13 Claims, 9 Drawing Sheets

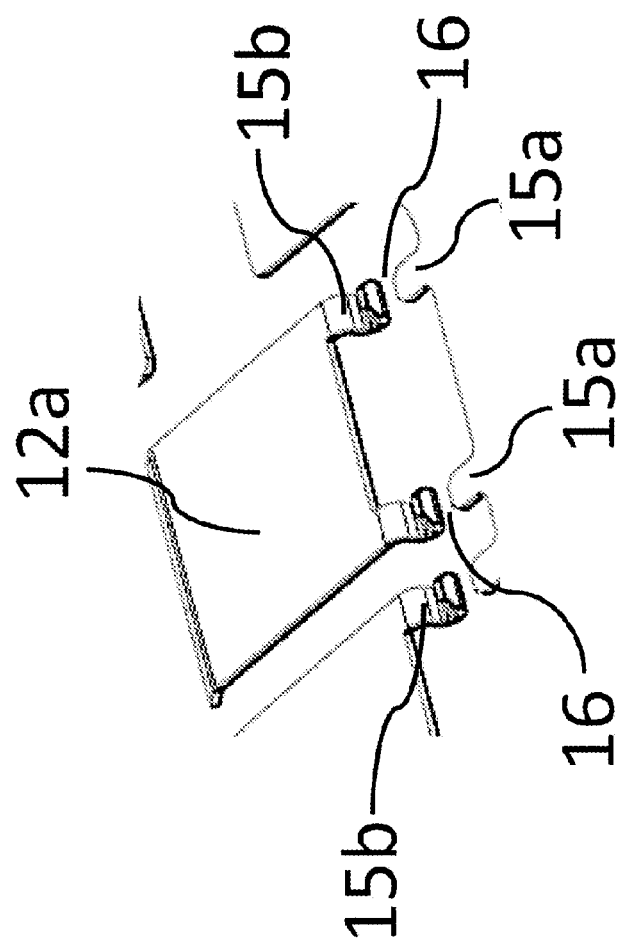

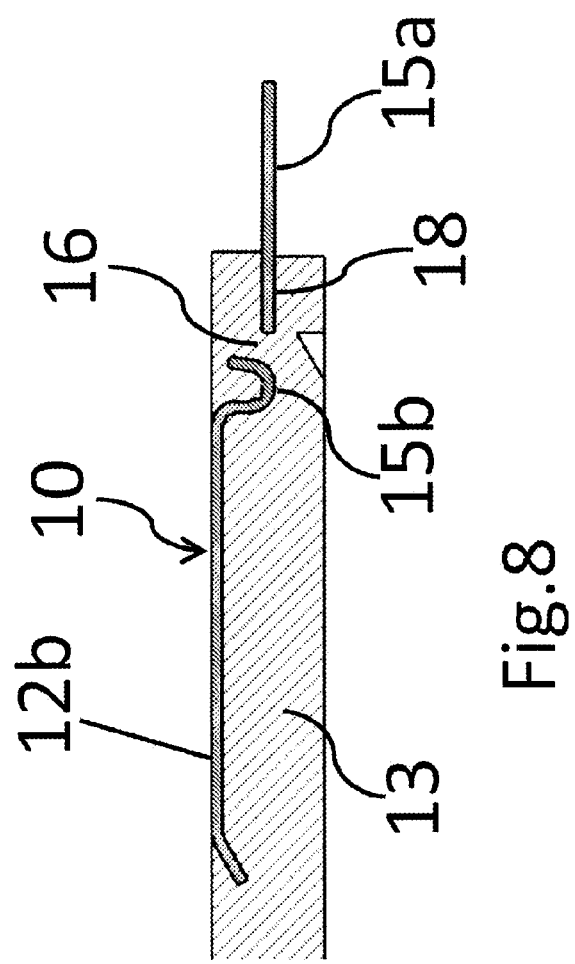

METHOD FOR PRODUCING A SMARTCARD BODY FOR RECEIVING A SEMICONDUCTOR CHIP AND SMARTCARD BODY OF THIS TYPE

CROSS-REFERENCE TO RELATED APPLICATIONS

This continuation application claims priority to PCT/EP2013/001245 filed on Apr. 25, 2013, which has published as WO 2013/159929 A1, and also German application numbers 10 2012 008 176.6 filed on Apr. 26, 2012 and 20 2012 004 102.9 filed on Apr. 26, 2012, the contents of which are fully incorporated herein with these references.

DESCRIPTION

1. Field of the Invention

The invention relates to a method for producing a smartcard body for receiving a semiconductor chip, wherein at least one lead frame of the smartcard body is formed in a carrier material, the at least one lead frame is connected with the carrier material via at least one material strip, and wherein an electrical insulating casing with a cavity adapted for receiving the semiconductor chip is formed by surrounding the lead frame with the casing to form the smartcard body. The invention also relates to a smartcard body adapted for receiving a semiconductor chip, wherein the smartcard body comprises a lead frame providing first contact areas at a first surface and second contact areas at a second surface which are connectable to connections of a semiconductor chip inserted in a cavity of the smartcard body.

2. Background of the Invention

A conventional method for producing a smartcard body and a smartcard body are known from EP 1 785 916. After the forming of the casing, the smartcard bodies manufactured according to this method are connected to the carrier material via material strips protruding the casing of the smartcard bodies. The material strips connecting the smartcard body with the carrier material are not coated by the insulating material of the casing and thus form in a disadvantageous manner points of possible corrosion. After insertion of the semiconductor chip in the smartcard body for forming a smartcard, the material strips must be cut through by the manufacturer of the smartcards, so that the thus formed smartcard can be detached from the carrier material. This, however, provides in a disadvantageous manner that the manufacturer of the smartcards has to perform this operating step for separating the smartcards, so that after the insertion of the semiconductor chip in the cavity of the smartcard body and its closing a further working station is necessary for cutting through the material strips.

It is an object of the present invention to provide a method for producing a smartcard body and an according smartcard body, which can be easily detached from the carrier material and provides no corrosion exposed areas.

SUMMARY OF THE INVENTION

This object is solved by the method according to the present invention in that before or during the forming of the casing the one material strip or the material strips connecting the lead frame with the carrier material are cut through, so that the one material strip or the material strips are each separated in a first strip part connected with the carrier material and a second strip part connected with the lead frame, thus forming an interspace, and when forming the casing, both of the first and second strip part of the one or more material strips are comprised by the casing.

The smartcard body according to the invention provides that the smartcard body comprises at least one material strip with a first strip part and a second strip part separated by an interspace, wherein the second strip part is connected with the lead frame of the smartcard body and the first strip part is connected with the carrier material, and that the casing of the smartcard body encloses the first strip part and the second strip part.

By the measures according to the invention a method for producing a smartcard body and an according smartcard body are provided in an advantageous manner, which have the advantage that no parts of the lead frame or other corrosion exposed elements are protruding from the casing of the smartcard body. Such smartcard body provides in an advantageous manner durability and stability against environmental influences. The measures according to the invention advantageously further provide that the smartcard body according to the invention is easily detachable from the carrier material, as an impact on the carrier material causes the parts of material strip connecting the smartcard body with the carrier material to be pulled out from the casing of the smartcard body, so that the smartcard body according to the invention can be separated easily. The method according to the invention provides in an advantageous manner that the interspaces according to the invention can be formed in a simple manner by disconnecting and separating the material strips.

A further advantageous embodiment of the method according to the invention provides that at least one of the second and the first strip part of the respective material strip is deformed to create the necessary spatial separation between the ends of the respective strip parts for forming the interspace between these two strip parts. Such a measure has the advantage that the forming of the interspace between two strip parts of a respective material strip can be performed in a simple manner.

A further advantageous embodiment of the invention provides that at least one material strip has at least one stamping. Such a measure has the advantage that the deforming of the respective strip part of the material strip to form the spatial separation of the strip part ends and the interspace between those is simplified.

Further advantageous embodiments of the invention are subject matter of dependent claims.

BRIEF DESCRIPTION OF THE DRAWINGS

The accompanying drawings illustrate the invention. In such drawings:

FIG. 6 is an enlarged view of region VI of FIG. 5;

FIG. 8 is a sectional view of the smartcard body of FIG. 7*a*.

DETAILED DESCRIPTION OF THE PREFERRED EMBODIMENTS

Figure 1:
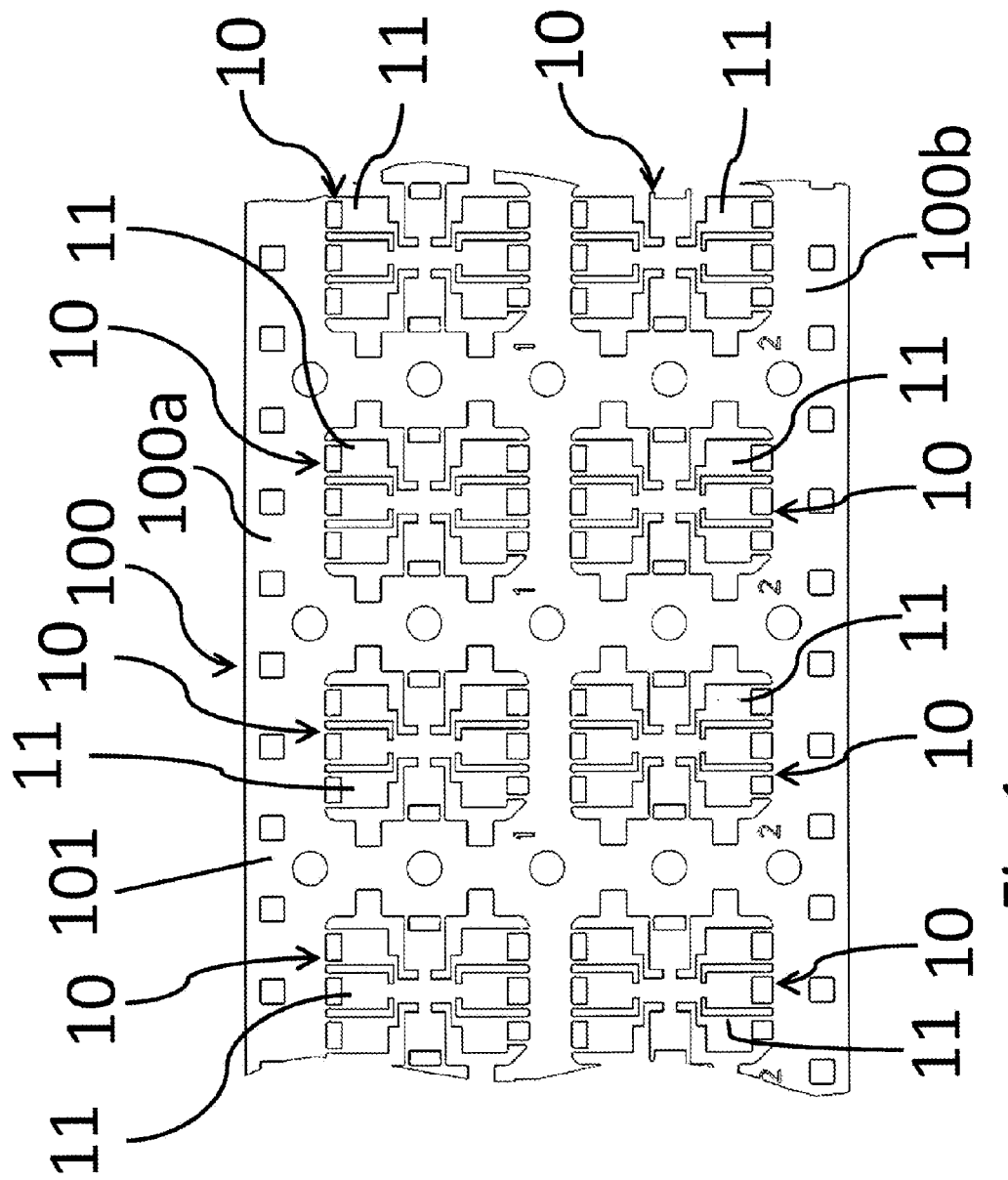
FIG. 1 is a top view of a first side of a carrier material.

The method for producing of a smartcard body, generally referenced by 10, is described with reference to the figures. FIG. 1 shows a top view of a first surface 100*a* of a carrier material 100. As can be seen from this figure, a plurality of smartcard bodies 10 are manufactured from the carrier material 100. The carrier material 100 comprises a conductive layer 101, which advantageously consists of copper sheeting; however, other materials such as aluminum are also possible. First, in a general known way and therefore not described further, lead frames 11 are formed from the carrier material 100, for example by punching or etching. As shown in FIG. 1, it is provided for the described embodiment, that within the width of the carrier material 100 two lead frames 11 for two smartcard bodies 10 are provided. It is however also possible, to provide only one single lead frame 11 for a smartcard body 10 or more that two lead frames 11 for a respective number of smartcard bodies 10 within the width of the carrier material 100.

It is preferred, that the carrier material 100 is formed as a band-shaped carrier material, which preferably consists of a roll of the conductive layer 101, so that a plurality of lead frames 11 for the smartcard bodies 10 can be produced by means of a roll-to-roll-process.

Figure 2:
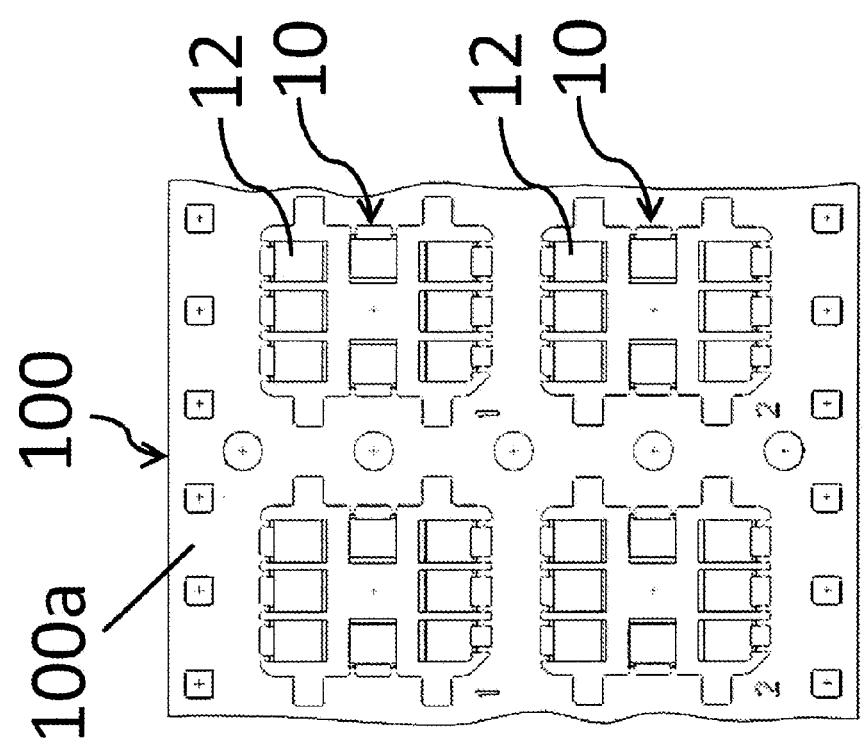
FIG. 2 is a top view of the carrier material of FIG. 1 after cutting of connecting webs.
Figure 3:
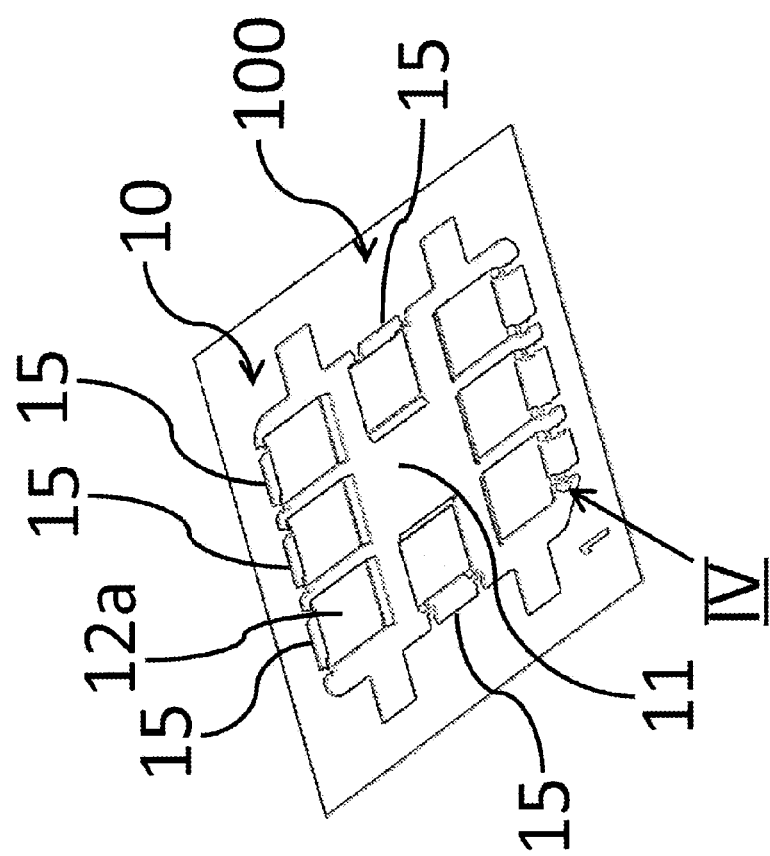
FIG. 3 is an enlarged view of the smartcard body of FIG. 2.

According to the before described and performed forming of the lead frames 11 of the smartcard bodies 10 first contact areas 12a are formed on the first surface 100a of the carrier material 100 shown in FIGS. 1, 2 and 3, and second contact areas 12b (shown in FIGS. 7a and 7b) are formed on a second surface 100b opposite to this first surface 100a by providing a conductive material at least at the areas of the contact areas 12a, 12b. This can be performed, for example, by electroplating, vapor-depositing, sputtering or similar methods. This method step is also known and is therefore not described in more detail.

The second contact areas 12b arranged on the second surface 100b of the carrier material 100 serve for providing connections to the connections of the semiconductor chip to be inserted in the smartcard body 10 and the first contact areas 12a serve for producing an electrical connection of the smartcard manufactured from the smartcard body 10 with an external component, for example a mobile phone, a card reader or similar. Preferably, during the manufacturing of the smartcard from the smartcard body 10 the connections of the semiconductor chip are connected with the second contact areas 12b in a general known manner by a bonding process, a welding process, a soldering process or the same.

As can be seen from FIG. 1, in the described embodiment a pre-stamped carrier material 100 is used. According structures, from which the lead frame 11 can then be manufactured, have been introduced already into the carrier material 100. As shown in FIG. 2, regions connecting the lead frame 11 with the carrier material 100 are separated from the carrier material 100, so that the lead frame 11 is essentially connected with the carrier material 100 via material strips 15 only. Then, preferably the contact areas 12a are positioned by bending, as shown in FIG. 2.

It is also possible to use a non-pre-stamped carrier material 100 and manufacture the lead frames 11 in a way generally known and therefore not described in detail. The exact way of forming a lead frame 11 from the carrier material 100 as well as further measures which are performed before manufacturing a casing 13 surrounding the lead frame 11 are known by the skilled person and are therefore not necessary for the understanding of the following description. Therefore, a detailed explanation of this part of the manufacturing process of the lead frames 11 is refrained from.

Before the lead frames 11 are injection molded with a plastic material for forming the casing 13 for insertion of the semiconductor chip, it is provided, that material strips 15 connecting the lead frame 11 with the carrier material 100 are cut through, so that an interspace 16 is formed between a strip part 15a of the respective material strip 15 connected with the carrier material 100 and a strip part 15b of this material strip 15 connected with the lead frame 11. The interspace 16 electrically insulates the two strip parts 15a, 15b. Preferably, this is performed in that the material strips 15 are deformed during or after the cutting through, so that thereby the interspace 16 is formed.

Figure 4:
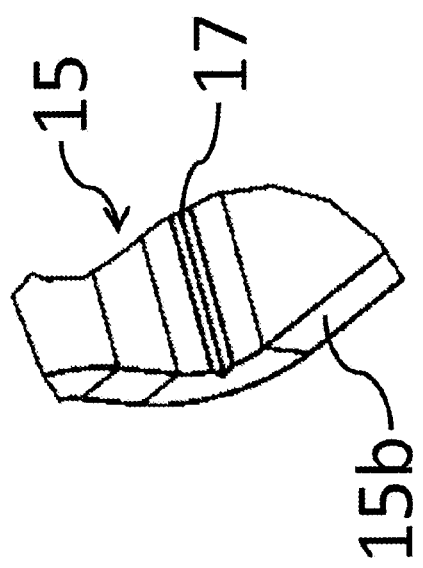
FIG. 4 is an enlarged view of region IV of FIG. 3.
Figure 5:
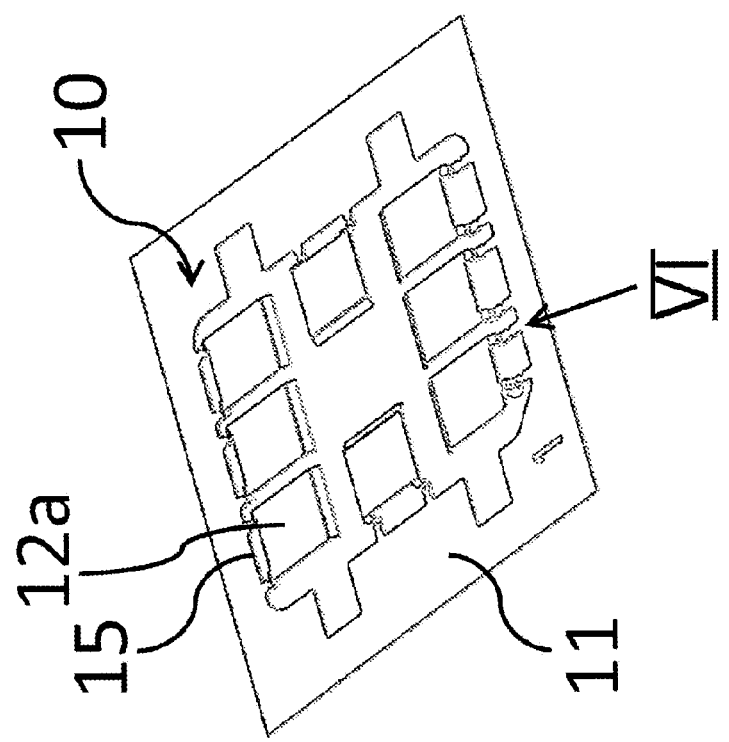
FIG. 5 is a view of the smartcard body without casing.

In the described embodiment—as best shown in FIG. 4—the strip parts 15b of the material strip 15 connected with lead frame 11 are deformed accordingly, so that their ends are spatially separated from the ends of the strip parts 15a and therefore the interspace 16 is formed. It is also possible, that the strip parts 15a of the material strip 15 itself are deformed accordingly. It is also possible, that for at least at one or more material strips 15 both strip parts 15a, 15b are deformed accordingly for forming the interspace 16. Instead of the deformation a material strip 15, it is also possible to provide a different way for separating the two strip parts 15a, 15b of the respective material strip 15 and thus insulate them electrically. For example it is also possible, that a short piece is punched out of one or more material strips 15, so that in this case no deforming is necessary. In the following it is assumed, that the material strips 15 are deformed, as this is the preferred way of carrying out of the method.

In FIG. 6 such formed material strips 15 are shown. It can be seen that the interspaces 16 clearly separate the strip parts 15a, 15b of the shown two material strips 15 and thus insulate them electrically.

In order to simplify the deforming process of material strips 15, it can be preferably provided that—as shown in FIG. 4—a groove 17 is stamped, formed or disposed in one or more material strips 15 which allows a deforming of the one or more material strips 15.

After the material strips 15 have been deformed to form the interspaces 16, as previously described and shown in FIG. 6, the casing 13 is then formed by injection molding the lead frame 11 with an insulating injection molding material. The casing 13 forms a circumferential border of the smartcard body 10 around the first as well as the second contact areas 12a, 12b respectively.

Figure 7A:
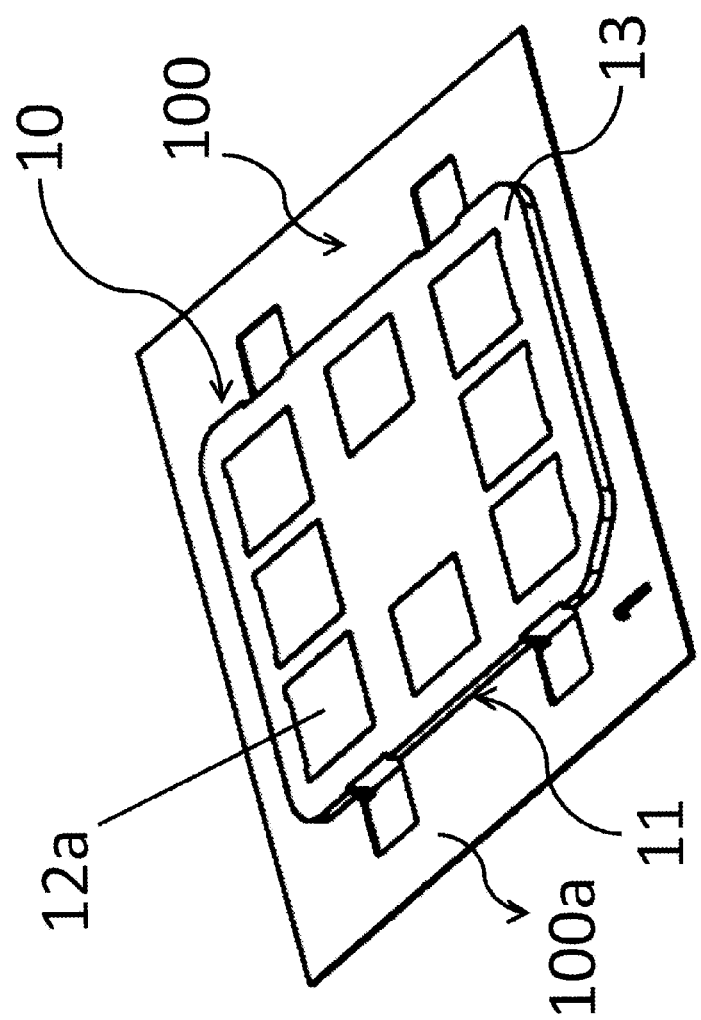
FIGS. 7*a* and 7*b* are views of both sides of an embodiment of the smartcard body.
Figure 7B:
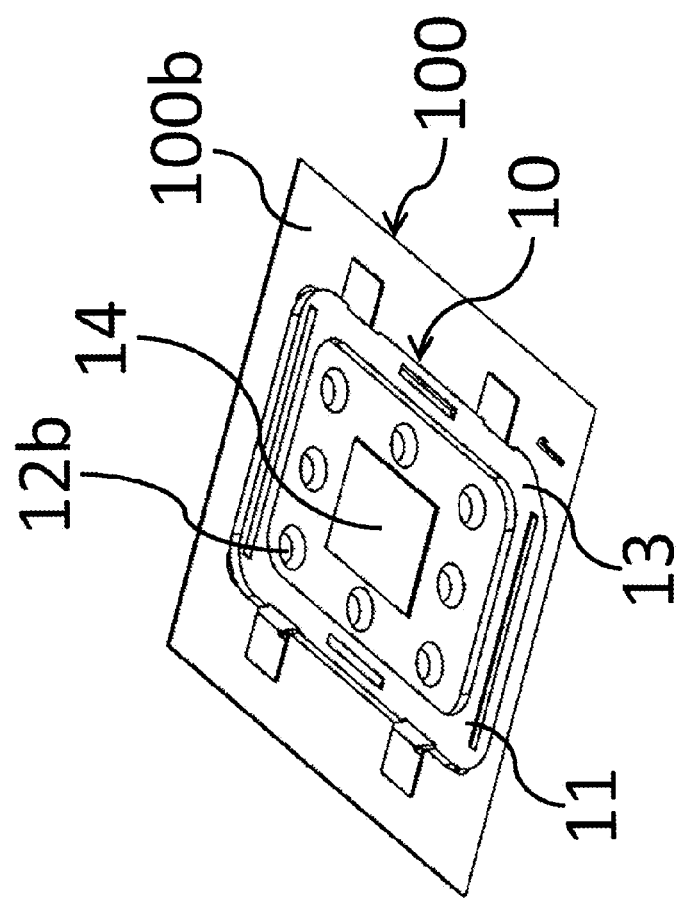

FIGS. 7a and 7b show the smartcard body 10 with the casing 13 produced as previously described. FIG. 7a hereby shows the contact areas 12a, which serve for contacting the smartcard manufactured from the smartcard body 10 with an external component. FIG. 7b shows the bond side of the smartcard body. A cavity 14 can be clearly seen, into which the semiconductor chip is inserted later.

The manufactured smartcard body 10 may correspond to the form of a 4FF smartcard. However, the described method is not restricted to the manufacturing of 4FF smartcard bodies 11. It is also possible to manufacture 1FF, 2FF or 3FF smartcard bodies with the described method, only to mention a few examples of use of the described method.

As best seen from FIG. 8, the casing 13 is formed in such a manner that it comprises (connects, captures, engages, holds) the first strip parts 15a of the material strips 15 as well as the second strip parts 15b. The smartcard body 10 is therefore kept in the carrier material 100 by a mechanical connection between the first strip parts 15a and the second strip parts 15b of the material strip 15 effected by the casing 13.

The user of the thus manufactured smartcard body 10 inserts in a known manner the semiconductor chip in the respective cavity 14 of the smartcard body 10, connects its connections with the contact areas 12b and closes the cavity 14 including the semiconductor chip, so that the smartcard is manufactured from the smartcard body 10 and the semiconductor chip.

To detach the smartcard from the carrier material 100, it is only necessary in an advantageous manner that the smartcard is pushed out of the carrier material 100. Impacting the smartcard body 10 leads to pulling out the strip parts 15a of the material strip 15 out of the casing 13. Thus, in the casing 13 remain only recesses 18, shown in FIG. 8, which, before the detaching of the smartcard from the carrier material 100, were accommodating the strip parts 15b of the material strips 15. The detaching of the smartcards from the carrier material 100 is therefore possible without a further cutting step. Such an approach has the advantage that no material strips of the carrier material 100, which could form corrosion areas, are protruding from the smartcard manufactured from this smartcard body 10.

Summarizing it is to be noted, that by the described method a smartcard body 10 can be formed, which has the advantage that the smartcard body and the accordingly manufactured smartcard can be easily detached from its accommodating carrier material 100 without a further disconnecting step, where advantageously the lead frame 11 is accommodated in the casing 13 in an insulated way, so that the smartcard manufactured from the smartcard body 10 does not provide corrosion exposed areas.

Although several embodiments have been described in detail for purposes of illustration, various modifications may be made to each without departing from the scope and spirit of the invention. Accordingly, the invention is not to be limited, except as by the appended claims.

What is claimed is:

1. A method for producing a smartcard body receiving a semiconductor chip, the method comprising:
   forming at least one lead frame of the smartcard body in a carrier material, said smartcard body being connected to the carrier material via at least one material strip;
   surrounding the at least one lead frame with an electrically insulating casing having a cavity for receiving the semiconductor chip; and
   separating, either before or during the forming of the casing, the at least one material strip connecting the at least one lead frame with the carrier material, so that the at least one material strip is separated into a first strip part connected with the carrier material and a second strip part connected with the lead frame thereby forming an interspace between the first strip part and the second strip part;
   wherein when forming the casing at least a portion of the first strip part as well as at least a portion of the second strip part of the at least one material strip is comprised by the casing.

2. The method according to claim 1, wherein when forming the interspace a deformation of at least one of the first strip part or the second strip part of the at least one material strip is performed.

3. The method according to claim 2, wherein at least one of the second strip part or the first strip part is bent to form the interspace.

4. The method according to claim 3, including the step of stamping a groove in the at least one material strip before the separating of the at least one material strip into a first strip part and second strip part.

5. The method according to claim 2, including the step of stamping a groove in the at least one material strip before the separating of the at least one material strip into a first strip part and second strip part.

6. The method according to claim 1, wherein at least one first contact area is formed on a first surface of the carrier material and at least one second contact area of the lead frame is formed on a second surface opposite to the first surface.

7. The method according to claim 1, wherein a plurality of smartcard bodies are manufactured in the carrier material and are detachable from the carrier material.

8. A method for manufacturing a smartcard, comprising:
   a) producing a smartcard body receiving a semiconductor chip, the method for producing a smartcard body comprising:
      i) forming at least one lead frame of the smartcard body in a carrier material, said smartcard body being connected to the carrier material via at least one material strip;
      ii) surrounding the at least one lead frame with an electrically insulating casing having a cavity for receiving the semiconductor chip; and
      iii) separating, either before or during the forming of the casing, the at least one material strip connecting the at least one lead frame with the carrier material, so that the at least one material strip is separated into a first strip part connected with the carrier material and a second strip part connected with the lead frame thereby forming an interspace between the first strip part and the second strip part;
      iv) wherein when forming the casing at least a portion of the first strip part as well as at least a portion of the second strip part of the at least one material strip is comprised by the casing; and
   b) inserting a semiconductor chip into the cavity of the casing.

9. The method according to claim 8, including the step of electrically connecting the semiconductor chip to the at least one second contact area.

10. The method according to claim 9, including the step of closing the cavity including the semiconductor chip.

11. The method according to claim 9, including the step of detaching the carrier material by impacting on the thus manufactured smartcard, wherein by this impact the first strip part connecting the smartcard body with the carrier material is detached from the casing of the smartcard body.

12. A smartcard body for receiving a semiconductor chip, the smartcard body comprising:
   a lead frame disposed within a smartcard body, the lead frame having on a first surface a first contact area and on a second surface a second contact area, wherein the first surface is opposite the second surface;
   a cavity formed in the smartcard body, wherein the first and second contact areas are connectable with connections of the semiconductor chip when received in the cavity of the smartcard body;
   at least one material strip with a first strip part separated by an interspace from a second strip part, wherein the second strip part is connected with the lead frame of the smartcard body and the first strip part is connected with a carrier material; and
   wherein the smartcard body encloses at least a portion of the first strip part and encloses at least a portion of the second strip part.

13. The smartcard body of claim 12, wherein the semiconductor chip is received and disposed in the cavity of the smartcard body.

* * * * *